US009765424B2

(12) United States Patent
Opfermann et al.

(10) Patent No.: US 9,765,424 B2
(45) Date of Patent: Sep. 19, 2017

(54) METHOD OF REFURBISHING HIGH VALUE ARTICLES

(71) Applicant: Engineering and Software System Solutions, Inc., San Diego, CA (US)

(72) Inventors: Benjamin C. Opfermann, Cottonwood Heights, UT (US); Craig P. Pessetto, Syracuse, UT (US); Douglas K. Wiser, Centerville, UT (US)

(73) Assignee: Engineering and Software System Solutions, Inc., San Diego, CA (US)

(*) Notice: Subject to any disclaimer, the term of this patent is extended or adjusted under 35 U.S.C. 154(b) by 80 days.

(21) Appl. No.: 14/631,705

(22) Filed: Feb. 25, 2015

(65) Prior Publication Data

US 2016/0244873 A1    Aug. 25, 2016

(51) Int. Cl.
| | |
|---|---|
| *C23C 14/00* | (2006.01) |
| *C23C 14/34* | (2006.01) |
| *C23C 14/02* | (2006.01) |
| *B64C 25/00* | (2006.01) |
| *C23C 14/04* | (2006.01) |

(52) U.S. Cl.
CPC .............. *C23C 14/34* (2013.01); *B64C 25/00* (2013.01); *C23C 14/021* (2013.01); *C23C 14/028* (2013.01); *C23C 14/046* (2013.01)

(58) Field of Classification Search
CPC .................................................. C23C 14/34
See application file for complete search history.

(56) References Cited

U.S. PATENT DOCUMENTS

| | | | |
|---|---|---|---|
| 5,026,466 A | 6/1991 | Wesemeyer et al. | |
| 5,272,735 A | 12/1993 | Bryan et al. | |
| 6,365,011 B1 | 4/2002 | Yumshtyk | |
| 2004/0055870 A1* | 3/2004 | Wei | C23C 14/022 204/192.3 |
| 2009/0148622 A1* | 6/2009 | Stoltenhoff | B23P 6/00 427/554 |
| 2011/0220490 A1* | 9/2011 | Wei | C23C 14/022 204/192.12 |
| 2014/0246313 A1 | 9/2014 | Erickson et al. | |
| 2014/0260955 A1 | 9/2014 | Aharonov | |

OTHER PUBLICATIONS

International Search Report and Written Opinion of the International Searching Authority issued on May 27, 2016 for International Application No. PCT/US2016/019262.

* cited by examiner

*Primary Examiner* — Timon Wanga
(74) *Attorney, Agent, or Firm* — Charles F. Reidelbach, Jr.

(57) ABSTRACT

A system and method for refurbishing an internal surface of an article of manufacture includes a sputtering unit. The internal surface of the article of manufacture defines an internal cavity. The sputtering unit includes an electrode assembly coupled to a sealing portion. The refurbishing method begins with preparing the internal surface to remove physical damage and contamination. Next, the sputtering unit is interfaced with the article by extending the electrode assembly into the cavity and sealing the sputtering unit to the article with the sealing portion. The internal surface of the article then defines a boundary of a sputtering chamber. A dimensional value is provided that is related to an internal dimension of the cavity. Finally the sputtering unit is operated to deposit material onto the internal surface based upon the provided dimensional value.

16 Claims, 13 Drawing Sheets

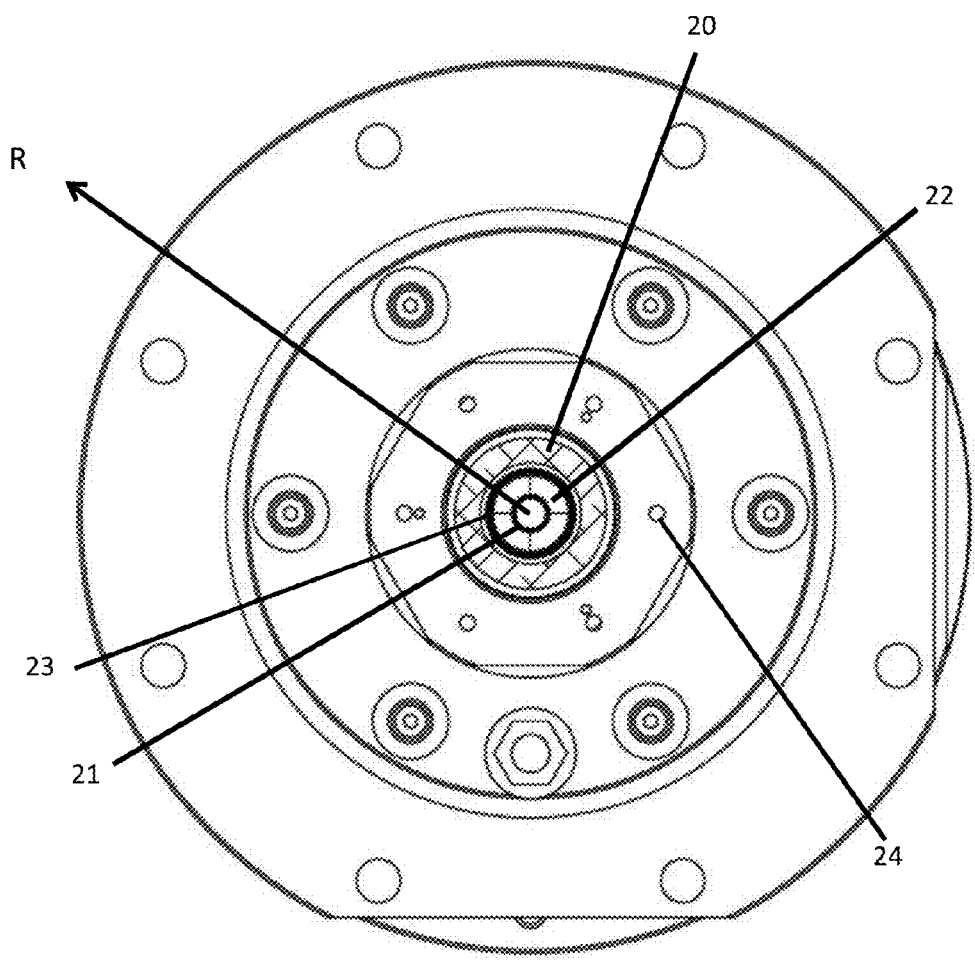
FIG. 4A: DETAIL FROM FIG. 4

METHOD OF REFURBISHING HIGH VALUE ARTICLES

FIELD OF THE INVENTION

The present invention concerns a method of manufacturing high value articles. More particularly the present invention concerns a method of restoring damaged internal surfaces of a high value service article such as aircraft landing gear.

BACKGROUND

The cost of operating of high value equipment such as aircraft is heavily dependent on maintenance. Replacement of "service articles" is perhaps the largest single maintenance expense. Such service articles tend to wear out over time. Because of this, there is a motivation to refurbish and reuse such service articles. However, this can be challenging when the wear occurs over precision internal surfaces.

In particular, service parts having internal wear surfaces defining internal cavities can be difficult to refurbish. An example of such a service part is the cylindrical landing gear strut of an aircraft. The strut includes an internal surface that provides the force for hydraulically raising and lowering the landing gear in response to pressure changes in a cylindrical cavity defined by the internal surface. Through the ongoing process of cycling the strut, the internal surface becomes damaged due to sliding wear and corrosion.

There is a need to find efficient and high quality ways of restoring such internal surfaces to their original factory dimensions and quality.

BRIEF DESCRIPTION OF THE FIGURES

FIG. 4A is a detail view taken from FIG. 2 to illustrate the anode and cathode arrangement of sputtering unit 2.

DETAILED DESCRIPTION OF THE PREFERRED EMBODIMENTS

Figure 1:
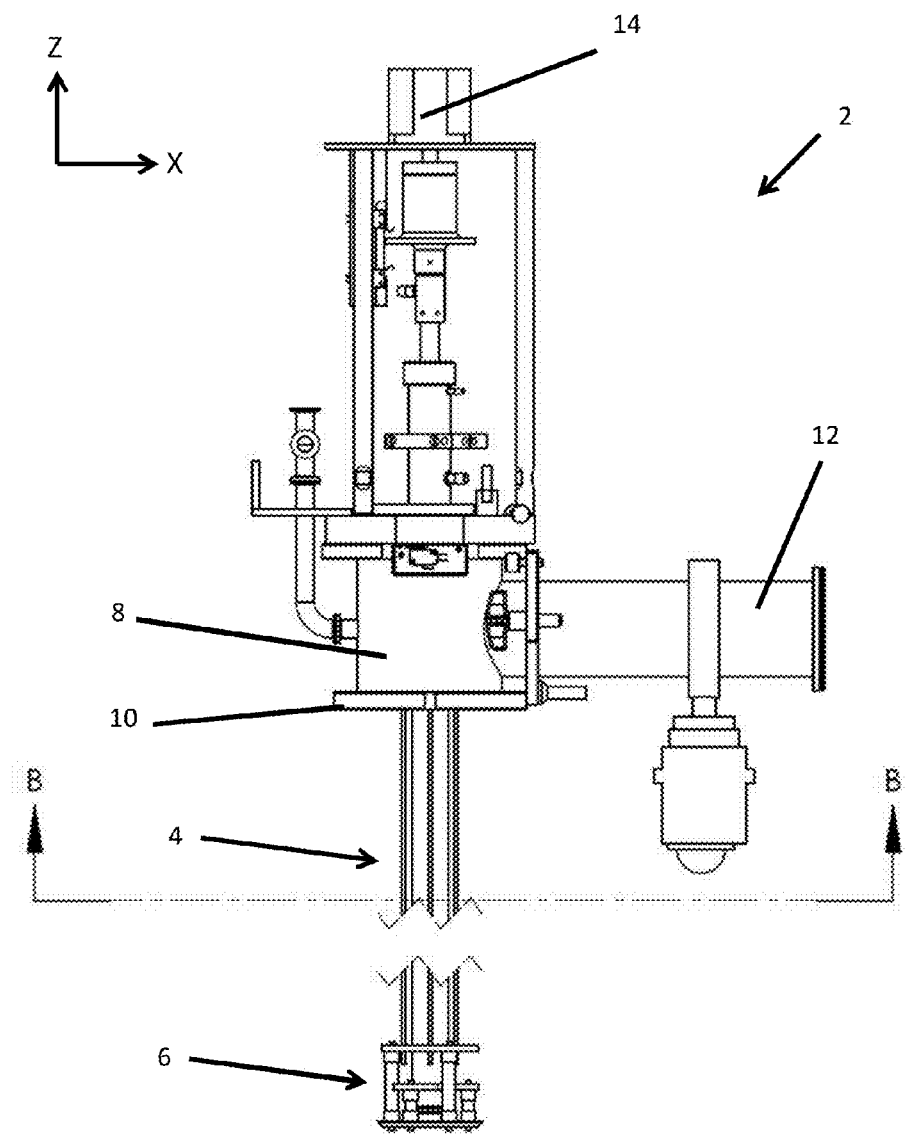
FIG. 1 is a schematic side view of an exemplary sputtering unit 2.

The present invention concerns a system and manufacturing process for refurbishing a service article or an article of manufacture. In an exemplary embodiment, the article of manufacture is a portion of aircraft landing gear. In a particular exemplary embodiment the article is a landing gear cylinder. In an alternative embodiment, the article can be a pipe such as a pipe for transporting a petroleum fluid such as shale oil. In another exemplary embodiment the article is a hydraulic actuator. The present invention is also applicable to yet other articles. In yet other alternative embodiments, portions of the manufacturing process can be applicable to the manufacture of new articles.

The article of manufacture has an internal surface defining an internal cavity. In an exemplary embodiment, the internal surface defines a cavity having a cylindrical geometry. In other embodiments, the internal surface may define a cavity having other geometries. In one exemplary embodiment the internal surface is defined by an aluminum wall. In other exemplary embodiments other wall materials may be used to define the internal surface.

The internal surface may have physical damage and contamination due to in-service use. The system of the present invention includes an apparatus for preparing the internal surface to remove physical damage and contamination from the internal surface. The apparatus for preparing the internal surface can include one or more components.

One or more of these components can include a fluid applicator and/or fluid bath for cleaning the internal surface. In the case of landing gear, a fluid bath can be used to remove grease and/or hydraulic fluids. Another bath can be used to strip off material such as anodized materials. Yet other baths can include solutions for etching or rinsing.

Another of these components can be a machining apparatus such as a honing tool. This may include an aluminum oxide hone. The machining removes damage to the inside surface but also increases an inside dimension of the cavity. The resultant machined inside dimension is typically larger than that which is required for use.

The system of the present invention includes a sputtering unit. The sputtering unit includes an electrode assembly that can be inserted into the internal cavity of the article to be coated. The electrode assembly has a geometry that is optimized for the internal surface of the article. For example, the electrode geometry may include an elongate anode/cathode arrangement for extending into an elongate cylindrical internal cavity of the article. This will assure effective uniform coating of the article's internal surface.

The sputtering unit is also configured with one or more vacuum sealing interface features or ports for providing vacuum coupling between the sputtering unit and the internal cavity of the article. When the sputtering unit is properly interfaced to the article, the internal surface of the article defines a portion of a boundary of a sputtering chamber. In an exemplary embodiment the internal surface of the article defines the majority of the sputtering chamber. This is a major advantage of the present invention because it reduces the size and cost of the sputtering equipment and allows the sputtering chamber to be evacuated rapidly.

An exemplary method of the present invention is to restore a previously damaged and contaminated internal surface of an article to a new condition. A new condition requires an undamaged surface defining a cavity having a specified internal dimension. An exemplary method can include the following steps:

First, the internal surface is prepared by removing physical damage and contamination from the internal surface. This preparation can include fluidic cleaning to remove contaminating fluids. This preparation can also include machining the internal surface to remove the physical damage. Machining may have the effect of increasing the internal dimension of the cavity to a value that is greater than the specified internal dimension.

Second, the article is prepared for a sputtering operation. This may include further cleaning and/or etching the internal surface. This may also include the application of physical shields inside the internal cavity to limit which surfaces receive sputtered material.

Third, the article is interfaced with the sputtering unit. Interfacing includes placing the electrode assembly into the internal cavity of the article. Interfacing also includes coupling one or more vacuum interfaces that provide a vacuum seal between the sputtering unit and the internal cavity of the article. In coupling the article with the sputtering unit, the internal surface of the article defines a portion of an inside surface of a sputtering chamber. In one embodiment the inside surface of the article receiving the sputtered material defines a majority of the inside surface area of the sputtering chamber. In one embodiment the inside surface of the sputtering chamber is an elongate cylinder having a major dimension along an axis of symmetry Z.

Fourth, the sputtering unit and coupled sputtering chamber are prepared for sputtering. A vacuum is applied to remove ambient gases (e.g., air and vapors) from the sputtering chamber. When the pressure is low enough, an inert gas such as argon is introduced into the sputtering chamber.

Fifth, the sputtering unit is operated to sputter deposit a material onto the inside surface of the article. This operation can be performed by applying a voltage between the anode and cathode. Sputtering is performed until the internal dimension of the cavity is restored to the specified internal dimension that is suitable or required for use of the article.

The combination of machining the surface and then sputtering whereby the surface mostly defines the sputtering chamber is a particularly advantageous and efficient way of providing a precision inside surface of a manufactured article. The machining is a way of accurately maintaining the inside geometry. This method of sputtering allows for a very rapid way of providing a precision internal surface with an accurate internal dimension.

In an exemplary embodiment the internal surface of the article and the material sputtered are both aluminum. In other exemplary embodiments other materials can be utilized including titanium and iron alloys. In yet other embodiments other materials can be used such as carbides and nitrides. In still other embodiments the material deposited can be a multilayer material with different compositions in each layer. The present invention encompasses all single or multilayer sputter coatings that are utilized to reduce an internal cavity dimension to a specified or required value.

Figure 8:
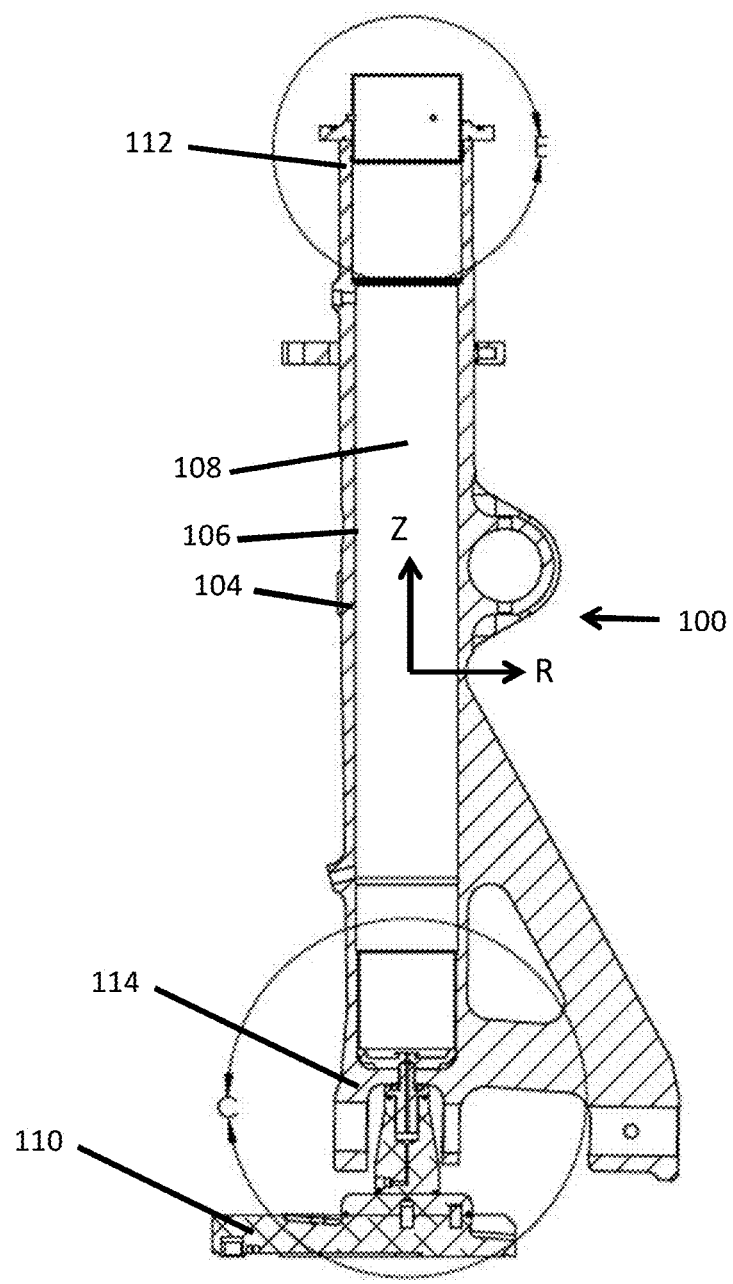
FIG. 8 is a sectional view taken from BB of FIG. 7 with portions of the transport apparatus 102 removed.
Figure 9:
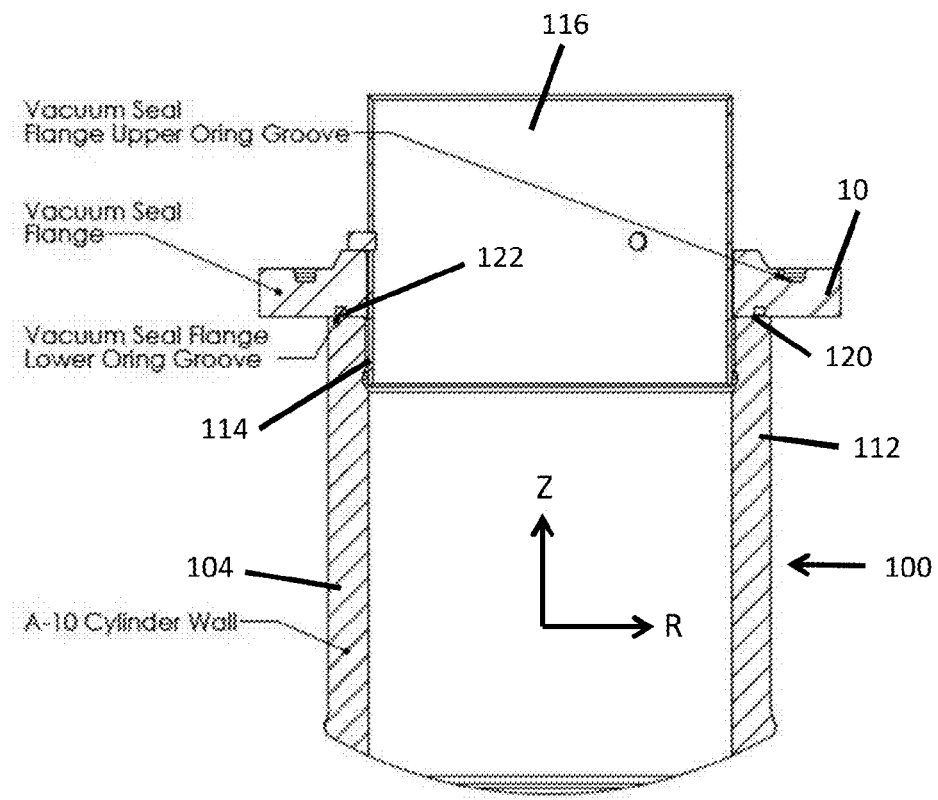
FIG. 9 is a detail view taken from detail indication E of FIG. 8.
Figure 10:
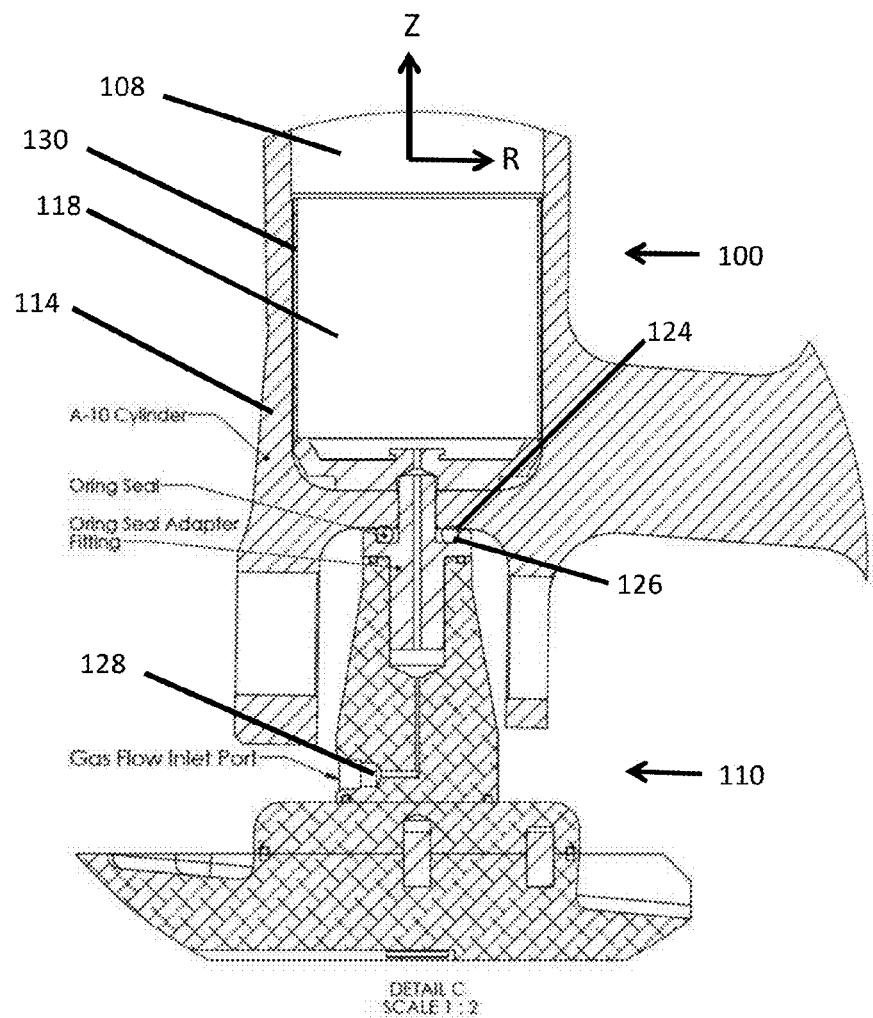
FIG. 10 is a detail view taken from detail indication C of FIG. 8.
Figure 11:
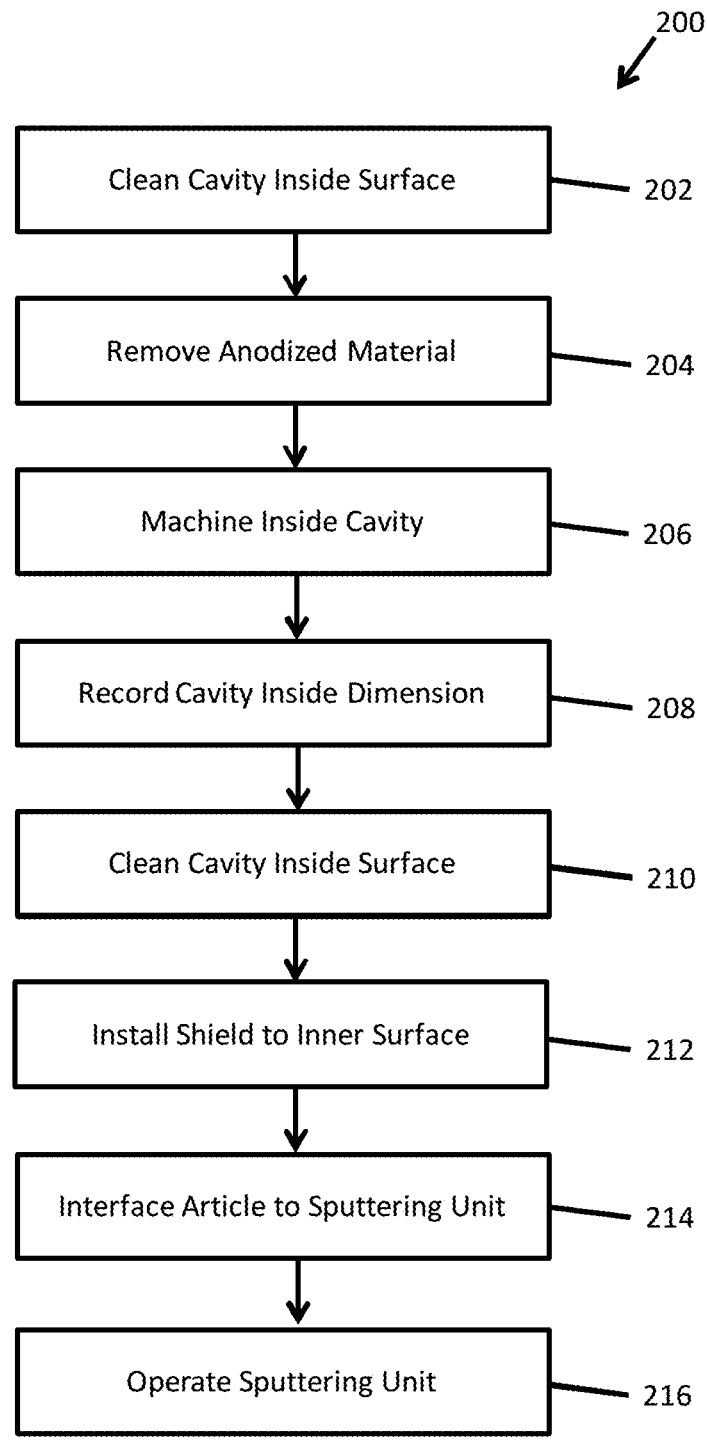
FIG. 11 is a flowchart representation of a process for refurbishing an article such as a portion of aircraft landing gear.
Figure 12:
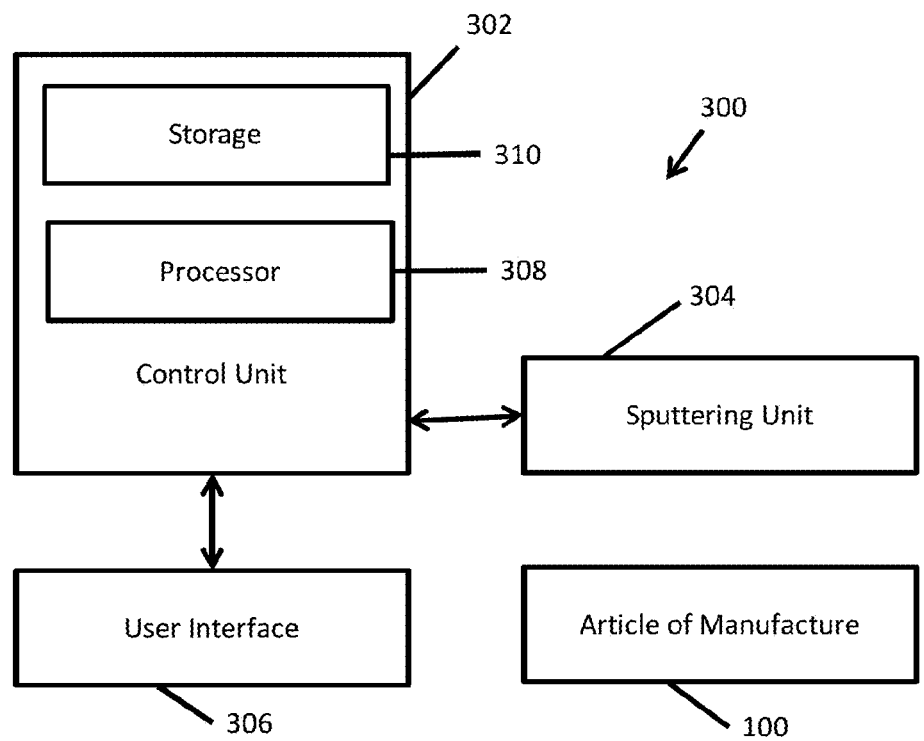
FIG. 12 is a block diagram representation of a system for sputter coating an article.
Figure 13:
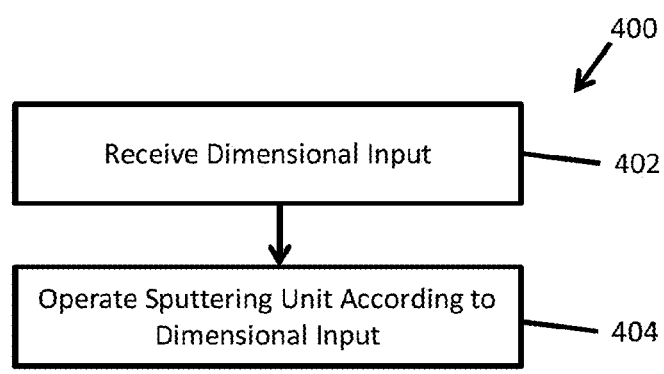
FIG. 13 is a flowchart representation of a method for sputter coating an article using the system of FIG. 12.

The following description describes an exemplary apparatus and method according to the present invention. FIGS. 1-4 illustrate a sputtering unit 2 that is utilized as part of a manufacturing or refurbishing method. FIGS. 5-10 illustrate an exemplary article of manufacture 100 that is being manufactured or refurbished using the sputtering unit 2. FIGS. 9 and 10 illustrate details of how the article of manufacture 100 is interfaced with portions of sputtering unit 2. Not all details of sputtering unit 2 are shown in FIGS. 5-10 for simplicity but it is to be understood that, for FIGS. 5-10, the sputtering unit 2 is interfaced with article 100 whereby an electrode assembly 4 (to be described in FIGS. 1-4) extends into article 100. FIG. 11 depicts an exemplary refurbishing process 200 that includes the use of sputtering unit 2. FIG. 12 depicts a system that includes a sputtering unit 304 under control of a control unit 302. FIG. 13 depicts an exemplary process 400 for operating the system 300.

Figure 2:
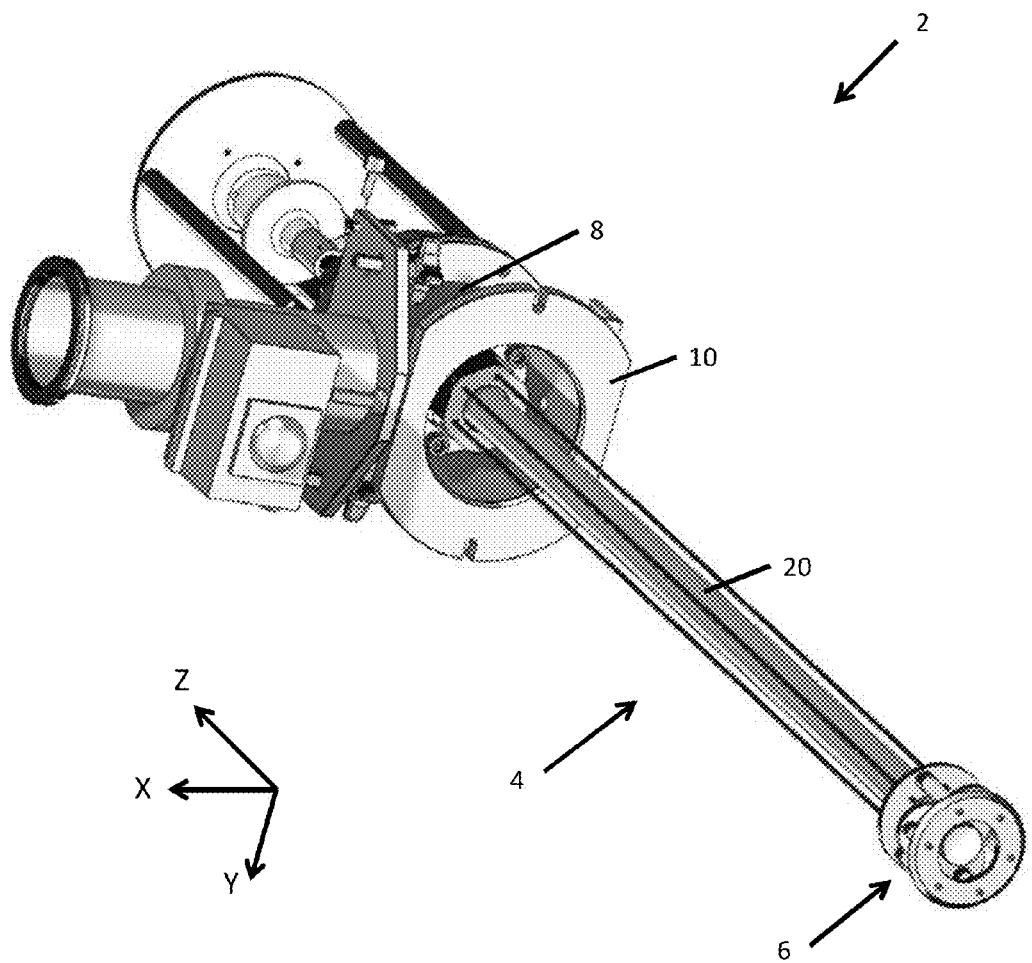
FIG. 2 is an isometric view of sputtering unit 2.

FIGS. 1-4 depict an exemplary sputtering unit 2 according to the present invention. Sputtering unit 2 is configured to interface with an article so as to sputter coat an internal surface with a material. To illustrate sputtering unit 2, mutually orthogonal axes X, Y, and Z are utilized. For purposes of illustration, the axis Z is considered to be centered upon and along a long axis of an article to be sputter coated. An axis R (FIG. 4A) is orthogonal to the Z-axis and the magnitude of R is the distance therefrom. FIG. 1 is a schematic side view of sputtering unit 2. FIG. 2 is a schematic isometric view of sputtering unit 2.

Sputtering unit 2 includes electrode assembly portion 4, an anode isolator assembly 6, a main vacuum chamber 8, vacuum sealing portion or flange 10, vacuum pumping port 12, and magnet string motion controller 14. Electrode assembly 4 is configured to be lowered into an internal cavity of an article. In the illustrated exemplary embodiment electrode assembly 4 is elongate with respect to axis Z in order to properly coat an elongate internal geometry of a cavity. During use, the elongate electrode assembly 4 is to be lowered into an internal cavity of an article which is to be sputter coated.

Figure 3:
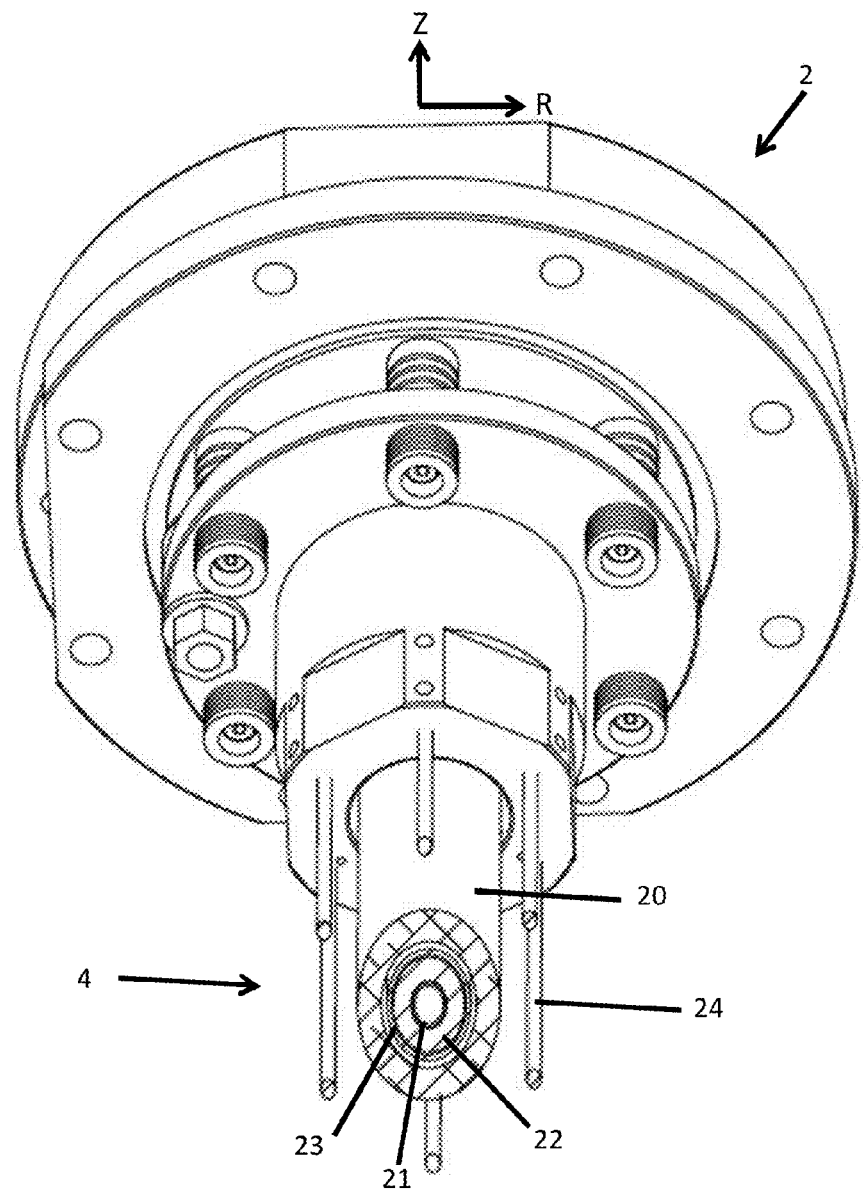
FIG. 3 is an isometric cutaway view of a portion of sputtering unit 2.

FIG. 3 is an isometric cutaway view of a portion of sputtering unit 2 illustrating the electrodes of electrode assembly 4. Note that FIG. 3 is shown without flange 10. Electrode assembly portion 4 includes central cathode 20 that is surrounded by anodes 24. Cathode 20 is hollow and contains magnet string 22 that is disposed between cylindrical inner sheath 21 and cylindrical outer sheath 23. Magnet string 22 forms magnetic field lines that enable high speed magnetron sputtering.

According to the illustrated embodiment there are six anodes 24 that surround the central cathode 20. In operation anodes 24 are disposed between the central cathode and an inside surface 106 of an article 100 (FIGS. 5-10) to be sputtered relative to the radius R (FIG. 4A). The anodes 24 are thin wires to minimize the amount of material deposited thereon so that most of the material will be deposited on the inside surface of the article. In one embodiment, the anode wires are each about 1 millimeter in diameter.

Figure 4:
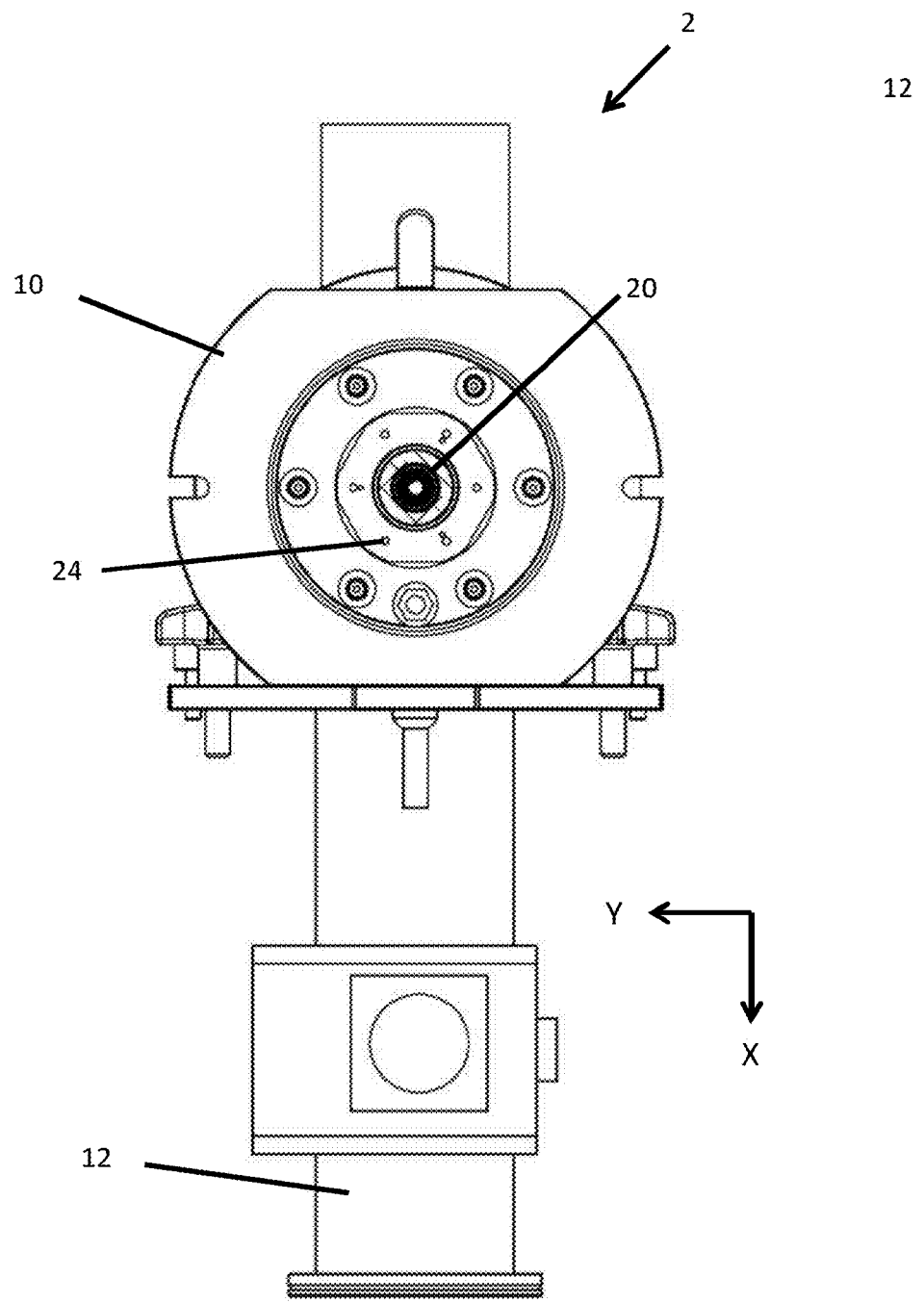
FIG. 4 is an upward view of a sputtering unit 2 in which the view is indicated by section BB of FIG. 1.

FIG. 4 is a view of sputtering unit 2 taken from section lines BB of FIG. 1. FIG. 4A is a detailed portion of FIG. 4 without flange 10. Relative to radius R, the magnet string 22 is contained between cylindrical inner sheath 21 and cylindrical outer sheath 23. The cylindrical outer sheath 23 and the magnetic string 22 are contained within a cylindrical hollow defined by central cathode 20. The anode wires 24 are arranged outside and around the central cathode 20. Thus, with an increasing radius R the arrangement is in this order: inner sheath 21, magnet string 22, outer sheath 23, cathode 20, anode wires 24, and article surface 106 (FIG. 8).

The electrode assembly 4 is designed to perform "magnetron sputtering" when inserted into the internal cavity of an article. Sputtering is performed using an ionized gas plasma that bombards a "target" which is made of the material used to coat the inside surface of the article. In our exemplary embodiment the target is cathode 20. "Magnetron" sputtering concerns the use of the magnet string 22 which confines the plasma to be in close proximity to the cathode 20 being eroded. The ionized gas bombards the cathode 20 thereby ejecting particles of the cathode material. As sputtering proceeds, the particles uniformly deposit upon the inside surface of the article.

FIGS. 5-10 depict details of an exemplary article of manufacture 100 that is to be processed according to the method of the present invention. The article of manufacture in this example is a landing gear cylinder ("LGC") 100.

FIGS. 5-10 also depict the vacuum interface between the article 100 and portions of the sputtering unit 2. Not all details of sputtering unit 2 are shown in FIGS. 5-10 for simplicity but it is to be understood that, for FIGS. 5-10, the sputtering unit 2 is interfaced with article 100 whereby the electrode assembly 4 extends into cavity 108 of article 100.

Figure 5:
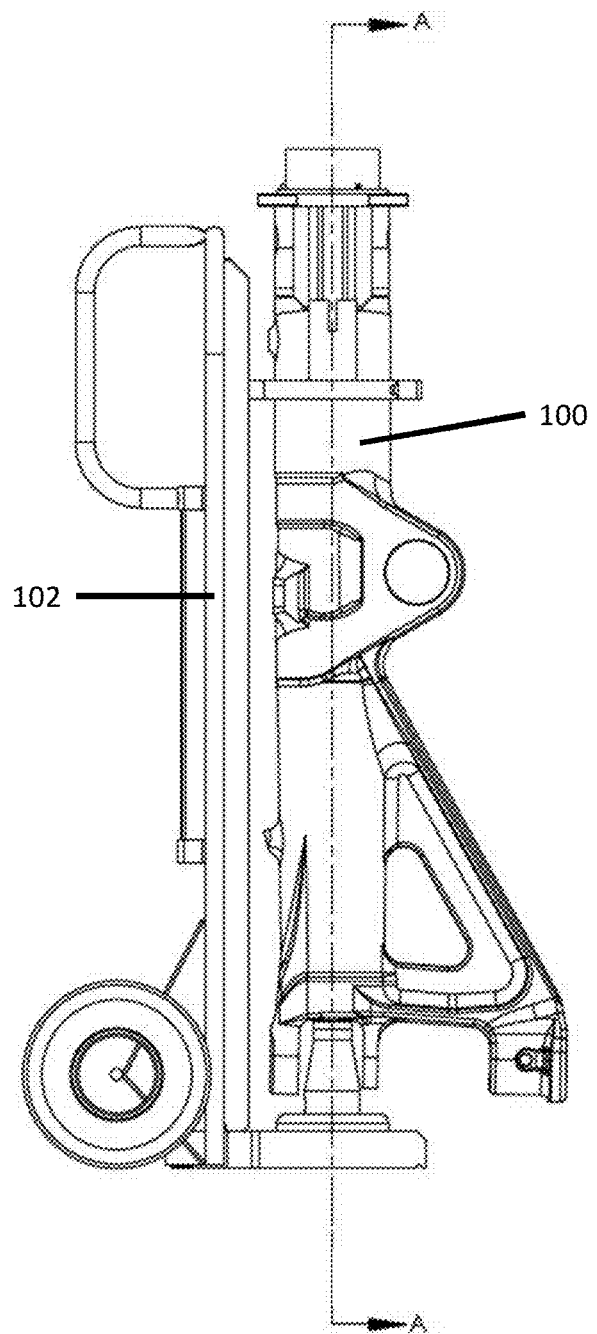
FIG. 5 is a side view of an article 100 supported by a transport apparatus 102.
Figure 6:
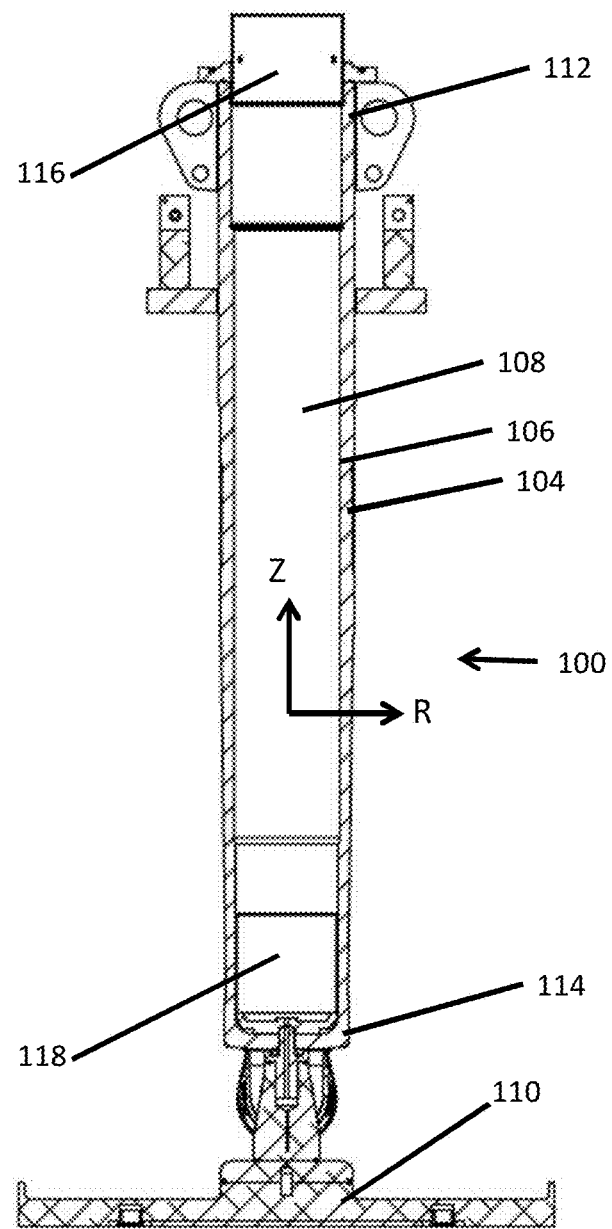
FIG. 6 is a sectional view taken from AA of FIG. 5.

FIG. 5 is a side view of article 100 loaded onto a transport apparatus 102 (e.g., a dolly). FIG. 6 is a cross sectional view of article 100 taken through section AA of FIG. 5. Article 100 has an outer cylindrical wall 104 with an inside cylindrical surface 106 that defines an internal cylindrical cavity 108. According to FIG. 6, vertical axis Z is centered upon cylindrical cavity 108 and radius R is the horizontal distance from vertical axis Z. Article 100 is supported by base 110. Article 100 includes an upper end 112 and a lower end 114 with respect to axis Z. Upper and lower shields 116 and 118 are installed in article 100 to limit which surfaces receive sputtered material.

Figure 7:
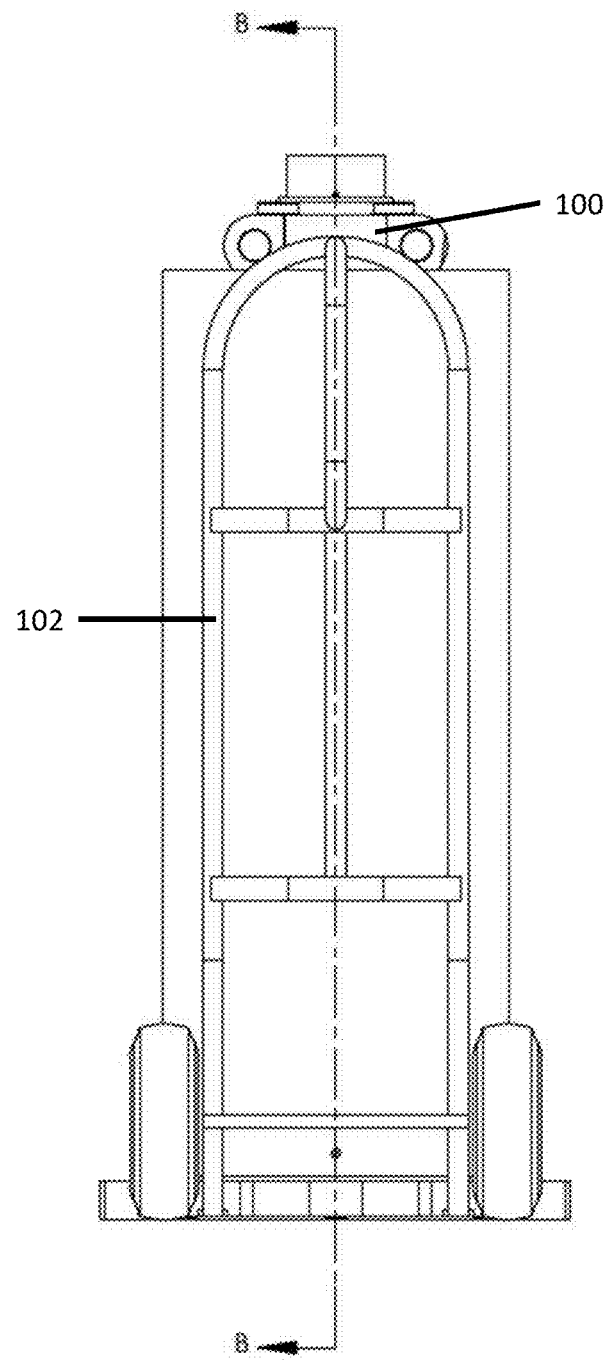
FIG. 7 is a rear view of sputtering unit 2 loaded onto transport apparatus 102.

FIG. 7 is a rear view of article 100 loaded onto transport apparatus 102. FIG. 8 is a cross sectional view of article 100 taken through section BB of FIG. 7 (with portions of the transport apparatus 102 removed). Sputtering unit 2 evacuates article 100 at upper end 112. Sputtering unit 2 introduces gas to article 100 at lower end 114 via base 110. Thus, the base provides a plurality of functions including providing mechanical support and routing gas from sputtering unit 2 to the inside cavity 108. The introduced gas provides the environment for magnetron sputtering.

FIG. 9 is cross-sectional detail E taken from FIG. 8 and depicts the upper end 112 of article 100 with additional features that enable proper coupling between article 100 and sputtering unit 2. To provide a proper vacuum seal, flange 10 of sputtering unit 2 is face-sealed to an upper annular surface 120 of the upper end 112 of article 100 via annular O-ring 122. Installed in the upper end 112 of article 100 is upper shield 116 which protects inwardly facing threads from being coated during the sputtering process.

FIG. 10 is cross-sectional detail C taken from FIG. 8 and depicts the lower end 114 of article 100 with additional features that enable proper coupling between article 100 and sputtering unit 2. Base 110 provides several functions: (1) mechanical support for article 100, (2) vacuum sealing of cavity 108, and (3) routing of gas into cavity 108. To provide a proper vacuum seal, base 110 is face-sealed to an annular lower surface 124 of the lower end 114 of article 100 via annular O-ring 126. A gas flow conduit 128 is formed into a portion of base 110 to allow a working gas to be introduced into cavity 108. Prior to installation shield 118 is installed to protect some lower inside surfaces 130 of article 100 from receiving material during sputtering.

FIG. 11 is a flowchart representation of an exemplary process 200 for refurbishing an article 100. Process 200 is particularly applicable to refurbishing the cylindrical inside surface 106 of landing gear. Prior to process 200, the inside surface 106 has physical damage and/or contamination from service. Steps 202 to 206 are performed to remove the physical damage prior to the sputtering operation.

Process step 202 begins with providing an article 100 that is contaminated and/or damaged from in-service wear. According to step 202, article 100 is then cleaned to remove grease and/or hydraulic fluids left behind. According to step 204, anodized material on inside surface 106 is stripped off. This is likely performed using an etchant.

According to step 206, the surface 106 is machined to remove physical damage from surface 106. The machining of step 206 results in a larger dimension of cavity 108. In particular, process step 206 can include honing to increase the internal diameter of cylindrical cavity 108. The resultant internal diameter is larger than a required diameter for cylindrical cavity 108.

According to step 208, the inside dimension of cavity 108 is recorded. This may include measuring the inside diameter of cavity 108 along the R-axis. This measurement may be performed using an inner diameter gauge.

According to step 210, surface 106 is cleaned following the machining step. The cleaning includes a cleaning process similar to that of steps 202 and 204. Another part of step 210 is a desmut bath. This can be performed using sodium hydroxide. Yet another part of step 210 is a rinse process which can be a double rinse in hot rinse baths to assure removal of all previously used chemicals.

According to step 212, upper and lower shields 116 and 118 respectively are installed into cavity 108. Shields 116 and 118 protect portions of surface 106 from receiving sputtered material during step 216.

According to step 214, article 100 is interfaced with the sputtering unit. Step 214 includes sealing flange 10 to upper end 112 of article 100. As part of this, O-ring 122 is face-sealed to upper annular surface 120. Step 214 also includes interfacing base 110 to the lower end of article 100. Annular O-ring 126 is sealed to lower annular surface 124. Also according to steps 214 and 216, the surface 106 to be coated defines the major portion of the vacuum vessel or chamber within which the sputtering process takes place.

According to step 216, the sputtering unit 2 is operated to deposit material onto inside surface 106 of article 100. As a first part of step 216 the cavity 108 is evacuated through the vacuum flange 10 using main vacuum chamber 8. Next, working gas is introduced into cavity 108 through the gas flow inlet port 128. Once the proper gas environment is established in cavity 108, a voltage is applied between anodes 24 and cathode 20. This causes erosion of cathode 20, the material of which deposits onto the inside cylindrical surface 106.

The process of sputtering onto surface 106 reduces an internal diameter of cavity 108 to a required value for article 100. The thickness of material deposited can be 150 microns (μm) or more. One micron equals $10^{-6}$ of one meter. In one embodiment the thickness deposited can be 200 microns or more. In another embodiment the thickness deposited can be 250 microns or more. In yet another embodiment the thickness deposited can be 300 microns or more. In still another embodiment the thickness deposited can be in a range of 200 to 300 microns. The internal radius of cavity 108 measured along radial direction R is thereby reduced by an amount equal to the thickness of material deposited until a desired and specified final radius is obtained. The internal diameter of cavity 108 is therefore reduced by an amount equal to twice the thickness of material deposited until a desired and specified final diameter is obtained.

While the process 200 of FIG. 11 has been described as a means of refurbishing an article 100, some of the process steps 200 can apply toward the manufacture of a new article. This process has various advantages over conventional processes including a way of providing a very precision and high quality internal surface 106.

FIG. 12 is a block diagram of an exemplary system 300 according to present invention. System 300 includes control unit 302 coupled to sputtering unit 304 and user interface 306. Sputtering unit 304 can be similar to or the same as the sputtering unit 2 described with respect to FIGS. 1-3 and can be utilized to coat an internal surface 106 of an article 100 as previously described.

Control unit 302 can be a computer including a processor 308 coupled to an information storage device 310. Information storage device 310 include non-transient memory such as flash memory, read-only memory, and/or a magnetic disc "hard" drive. Information storage device stores non-transient information defining computer code that, when executed by processor 308, executes process steps for operating the sputtering unit 304.

Exemplary process steps executed by processor 308 are illustrated in flow chart form with respect to FIG. 13. FIG. 13 depicts a process sequence 400 including steps 402 and 404. According to step 402, the control unit 302 receives a dimensional input. In one embodiment the dimensional input is received when a user of system 300 inputs or selects a thickness value into user interface 306.

According to step 404, the control unit operates the sputtering unit in accordance with the dimensional input received. Step 404 of FIG. 13 corresponds to step 216 in which a thickness of material is sputter coated onto the internal surface 106.

The specific embodiments and applications thereof described above are for illustrative purposes only and do not preclude modifications and variations encompassed by the scope of the following claims.

What we claim is:

1. A method of refurbishing a previously used article, the previously used article having an internal surface defining an internal cavity comprising:
    preparing the internal surface to remove physical damage and contamination from the internal surface whereby preparing the internal surface includes changing an internal dimension of the internal cavity by removing material from the internal surface;
    engaging a sputtering unit with the article after preparing the internal surface whereby a sputtering electrode assembly portion of the sputtering unit is placed into the cavity and a sealing portion of the sputtering unit is sealed to the article and the internal surface of the article defines a boundary of a sputtering chamber;
    determining a dimensional value related to changing the internal dimension of the internal cavity; and
    operating the sputtering unit after engaging the sputtering unit to deposit a sufficient thickness of material onto the internal surface based upon the determined dimensional value.

2. The method of claim 1 wherein the article of manufacture is a landing gear cylinder and the internal surface is a cylindrical internal surface of the landing gear cylinder.

3. The method of claim 1 wherein preparing the internal surface includes cleaning to remove contaminating fluids.

4. The method of claim 1 wherein preparing the internal surface includes increasing an internal dimension of the internal cavity to a size that is larger than a required dimension for the article and the sufficient thickness of deposited material restores the internal dimension to the required dimension.

5. The method of claim 1 wherein preparing the internal surface includes installing at least one shield to protect a portion of the internal surface from sputtered material.

6. The method of claim 1 wherein the internal dimension is measured before operating the sputtering unit and the dimensional value is determined at least partly by the measurement.

7. The method of claim 1 wherein the internal surface of the article defines the majority of an internal cavity of the sputtering chamber having an elongate cylindrical shape.

8. The method of claim 1 wherein a thickness of material deposited is at least 150 microns.

9. The method of claim 8 wherein an internal diameter of the cavity is reduced by at least 300 microns.

10. The method of claim 1 wherein the thickness of material deposited is at least 200 microns.

11. The method of claim 1 wherein the thickness of material deposited is at least 250 microns.

12. The method of claim 1 wherein the thickness of material deposited is at least 400 microns.

13. A method of refurbishing a previously used article, the previously used article having an internal surface defining an internal cavity, the internal surface having defects due to use of the previously used article comprising:
    honing the internal surface of the article to provide a cylindrical machined internal surface of the article that is free of the defects and having a machined internal diameter that is larger than a required diameter for the article;
    preparing the internal surface to remove contamination due to the machining process and to prepare a surface for a sputtering operation;
    engaging a sputtering unit for the sputtering operation with the article whereby a sputtering electrode assembly portion of the sputtering unit is placed into the cavity and a sealing portion of the sputtering unit is sealed to the article and the internal surface of the article defines a boundary of a sputtering chamber; and
    performing the sputtering operation by operating the sputtering unit to deposit sufficient material onto the internal surface whereby the internal diameter is reduced to the required diameter.

14. The method of claim 13 wherein the article of manufacture is a landing gear cylinder and the internal surface is an internal surface of the landing gear cylinder.

15. The method of claim 14 wherein the honed cylindrical internal surface is centered upon the cylindrical landing gear.

16. The method of claim 13 wherein the internal diameter is reduced by at least 300 microns.

* * * * *